US008276045B2

(12) United States Patent
Cideciyan et al.

(10) Patent No.: US 8,276,045 B2
(45) Date of Patent: Sep. 25, 2012

(54) ECC INTERLEAVING FOR MULTI-TRACK RECORDING ON MAGNETIC TAPE

(75) Inventors: Roy D. Cideciyan, Rueschlikon (CH);
Evangelos S. Eleftheriou, Zurich (CH);
Hisato Matsuo, Kanagawa (JP);
Thomas Mittelholzer, Zurich (CH);
Paul J. Seger, Tucson, AZ (US);
Keisuke Tanaka, Tokyo-to (JP)

(73) Assignee: International Business Machines Corporation, Armonk, NY (US)

( * ) Notice: Subject to any disclaimer, the term of this patent is extended or adjusted under 35 U.S.C. 154(b) by 905 days.

(21) Appl. No.: 12/351,738

(22) Filed: Jan. 9, 2009

(65) Prior Publication Data
US 2010/0180180 A1    Jul. 15, 2010

(51) Int. Cl.
*G11C 29/00* (2006.01)
(52) U.S. Cl. ....................................... 714/771
(58) Field of Classification Search ................... 714/771
See application file for complete search history.

(56) References Cited

U.S. PATENT DOCUMENTS

| | | | | |
|---|---|---|---|---|
| 5,559,644 | A * | 9/1996 | Ozaki et al. ..................... | 360/48 |
| 6,282,039 | B1 | 8/2001 | Bartlett | |
| 6,631,485 | B1 * | 10/2003 | Morley et al. ................. | 714/701 |
| 7,127,554 | B2 | 10/2006 | Buckingham | |
| 2003/0026025 | A1 * | 2/2003 | Maple et al. .................... | 360/53 |
| 2004/0199854 | A1 * | 10/2004 | Urata et al. .................... | 714/763 |
| 2006/0085718 | A1 * | 4/2006 | Jaquette et al. ............... | 714/752 |
| 2008/0155374 | A1 * | 6/2008 | Tanaka .......................... | 714/755 |
| 2008/0235556 | A1 * | 9/2008 | Eleftheriou et al. .......... | 714/755 |

FOREIGN PATENT DOCUMENTS

EP    0957484    11/1999

OTHER PUBLICATIONS

Jaquette, G.A., "LTO: A better format for mid-range tape", Jul. 2003.*

* cited by examiner

*Primary Examiner* — Gabriel Chu
(74) *Attorney, Agent, or Firm* — Dan Shifrin

(57) ABSTRACT

Conventional C2 coding and interleaving for multi-track data tape in LTO-3/4 do not support recording data onto a number of concurrent tracks which is not a power of two. Higher-rate longer C2 codes, which do not degrade error rate performance, are provided. An adjustable format and interleaving scheme accommodates future tape drives in which the number of concurrent tracks is not necessarily a power of two. A data set is segmented into a plurality of unencoded subdata sets and parity bytes are generated for each row and column. The parameters of the C2 code include $N_2$ as the least common multiple of the number of possible tracks to which codeword objects are to be written. COs are formed from $N_2$ C1 codewords, mapped onto a logical data track according to information within headers of the CO and modulation encoded into synchronized COs which are written to the tape.

29 Claims, 8 Drawing Sheets

ECC/CO-Interleaving Scheme

Encoded subdata set

Unencoded subdata set

Codeword Object for LTO-4 data format

Alternative Codeword Object

C2-encoder for [96, 84, 13]-RS code

Layout of the COs of two pairs of SDSs along T=24 tracks

| Rev Sync | CWI-2 | Header | Re-Sync | CWI-2 | Header | Fwd Sync | VFO |
|---|---|---|---|---|---|---|---|
| 17 | 4080 | 85 | 34 | 4080 | 85 | 17 | 255 |

Synchronized Codeword Object for LTO-4 Data Format

FIG. 9

| VFO | Fwd Sync | Header | CWI-4 | Re-Sync | CWI-4 | Header | Rev Sync |
|---|---|---|---|---|---|---|---|
| $L_{VFO}$ | $L_{FS}$ | $10{\times}8/R_H$ | $960{\times}8/R$ | $L_{RS}$ | $960{\times}8/R$ | $10{\times}8/R_H$ | $L_{FS}$ |

Alternative Synchronized Codeword Object

FIG. 10

ECC INTERLEAVING FOR MULTI-TRACK RECORDING ON MAGNETIC TAPE

RELATED APPLICATION DATA

The present application is related to commonly-assigned U.S. Pat. No. 7,876,516, entitled REWRITE-EFFICIENT ECC/INTERLEAVING FOR MULTI-TRACK RECORDING ON MAGNETIC TAPE, and commonly-assigned and co-pending U.S. application Ser. No. 12/351,756, entitled REWRITING CODEWORD OBJECTS TO MAGNETIC DATA TAPE UPON DETECTION OF AN ERROR, both filed on the same date as the present application, and both of which are hereby incorporated herein by reference in their entireties.

TECHNICAL FIELD

The present invention relates generally to formatting data to be recorded onto magnetic tape and, in particular, to an adjustable ECC format and interleaving process to accommodate tape drives having a multiple of eight transducers/sensors per head to read and write from/to a multiple of eight number of tracks simultaneously.

BACKGROUND ART

The Linear Tape Open (LTO) formats Generations 3 and 4 use error-correcting codes (ECC), which are based on a 2-dimensional product code. The C1-code is arranged along the rows of the 2-dimensional array. It is an even/odd interleaved Reed-Solomon (RS) code of length 240 giving rise to a row of length 480. The C2-code is arranged along the columns of the array. It is a RS-code of length 64 and dimension 54. The codewords are 2-dimensional arrays of size 64×480 and they are called subdata sets in the LTO standard. It is anticipated that future generation of drives will write on more than 16 tracks simultaneously. However, all current generations of LTO formats (Gen-1 to Gen-4) are based on the above C2 coding scheme which, together with its associated interleaving, cannot accommodate future tape-drive systems that will support heads with 16, 24, 32 or 48 (or other multiple of eight) transducers/sensors per head to read/write 16, 24, 32 or 48 (or other multiple of eight) concurrent tracks, respectively.

SUMMARY OF THE INVENTION

The present invention provides higher-rate and longer C2 codes, which do not degrade error rate performance. The code rate associated with these C2 codes is greater than the LTO-3/4 C2 code rate 54/64 and the codeword length is greater than the LTO-3/4 C2 codeword length 64. In particular, the present invention provides a C2 code with rate $K_2/N_2=84/96$ and codeword length $N_2=96$ and a corresponding encoder.

More specifically, the present invention provides methods, apparatus and computer program product for writing data to multi-track tape. In one embodiment, a method comprises receiving a stream of user data symbols, the stream comprising a data set and segmenting the data set into a plurality S of unencoded subdata sets, each subdata set comprising an array having K2 rows and K1 columns. For each unencoded subdata set, N1−K1 C1-parity bytes are generated for each row of a subdata set which are appended to the end of the row to form an encoded C1 codeword having a length N1. Similarly, for each unencoded subdata set, N2−K2 C2-parity bytes are generated for each column of the subdata set which are appended to the end of the column to form an encoded C2 codeword having a length N2, whereby an encoded subdata set is generated having N2 C1 codewords. From the S encoded data subsets, a plurality (S×N2)/2 codeword objects (COs) are formed, each comprising a first header, a first C1 codeword, a second header and a second C1 codeword. Each CO is mapped onto a logical data track according to information within the headers of the CO and modulation encoded into synchronized COs that contain various sync patterns in addition to modulation encoded COs. T synchronized COs are then written simultaneously to the tape, where T equals the number of concurrent active tracks on the tape.

In another embodiment, a data storage tape device comprises a host interface through which a stream of user data symbols comprising a data set is received and a segmenting module operable to segment the data set into a plurality S of unencoded subdata sets, each subdata set comprising an array having K2 rows and K1 columns. A C1 encoder is operable to generate N1−K1 C1 parity bytes for each row of a subdata set and append the C1 parity bytes to the end of the row to form an encoded C1 codeword having a length N1 and a C2 encoder is operable to generate N2−K2 C2 parity bytes for each column of the subdata set and append the C2 parity bytes to the end of the column to form an encoded C2 codeword having a length N2, whereby an encoded subdata set is generated having N2 C1 codewords. A codeword object formatter is operable to form a plurality (S×N2)/2 codeword objects (COs) from the S encoded data subsets, each CO comprising a first header, a first C1 codeword, a second header and a second C1 codeword. A codeword object interleaver is operable to map each CO onto a logical data track according to information within the headers of the CO. A modulation encoder is operable to encode the COs into synchronized COs that contain various sync patterns in addition to modulation encoded COs. A write channel, including a write head, is operable to write T synchronized COs simultaneously to the tape, where T equals the number of concurrent active tracks on the tape.

BRIEF DESCRIPTION OF THE DRAWINGS

FIG. 9 illustrates a synchronized CO of the present invention; and

FIG. 10 illustrates an alternative synchronized CO of the present invention.

DETAILED DESCRIPTION OF THE PREFERRED EMBODIMENT

Some of the functional units described in this specification have been labeled as modules in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like. Modules may also be implemented in software for execution by various types of processors. An identified module of executable code may, for instance, comprise one or more physical or logical blocks of computer instructions which may, for instance, be organized as an object, procedure, or function. A module of executable code could be a single instruction, or many instructions, and may even be distributed over several different code segments, among different programs and across several memory devices.

Furthermore, the described features, structures, or characteristics of the invention may be combined in any suitable manner in one or more embodiments. In the following description, numerous specific details are provided, such as examples of programming, software modules, hardware modules, hardware circuits, etc., to provide a thorough understanding of embodiments of the invention. One skilled in the relevant art will recognize, however, that the invention can be practiced without one or more of the specific details, or with other methods, components and so forth. In other instances, well-known structures, materials, or operations are not shown or described in detail to avoid obscuring aspects of the invention.

Figure 1:
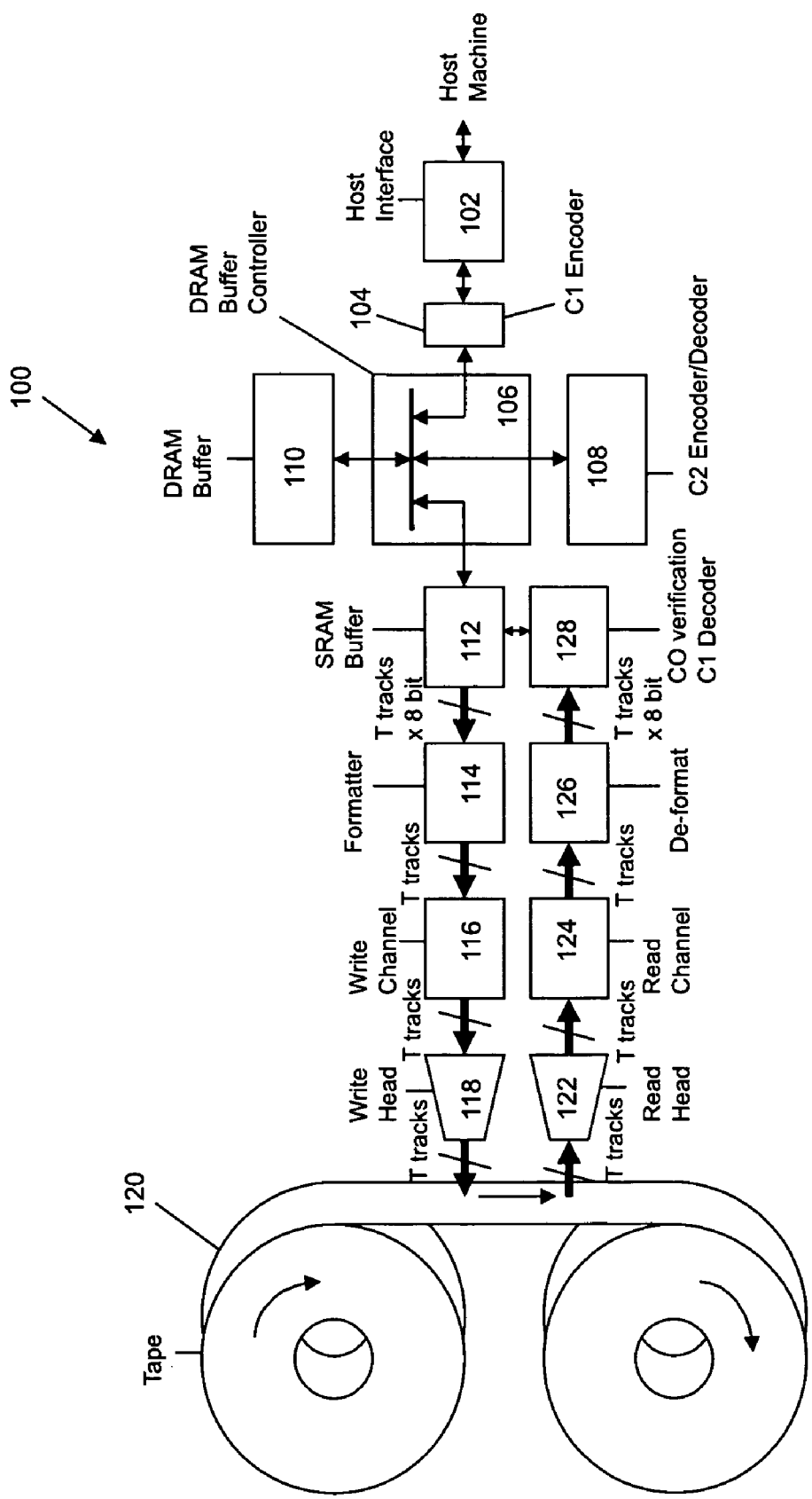
FIG. 1 is a block diagram of a magnetic tape drive with which the present invention may be implemented.

FIG. 1 is a high level block diagram of a data tape drive 100 in which the present invention may be incorporated. Data to be recorded is transmitted from a host (not shown) to the drive 100 through a host interface 102. The data undergoes a first encoding in a C1 encoder 104 and passed to a DRAM buffer controller 106. The C1-encoded data undergoes a second encoding in a C2 encoder 108 and is stored in a DRAM buffer 110. The data is subsequently stored in an SRAM buffer 112 and formatted in a formatter 114. Formatted data is sent to a write channel and then to a write head 118 which records the data onto the tape 120.

When the data is read back from the tape 120, a read head 122 detects the data and passes it to a read channel. The data is then processed in a de-formatter 126 and COs are verified in a verifier 128. The data is then decoded and, ultimately, sent to the requesting host.

Figure 2:
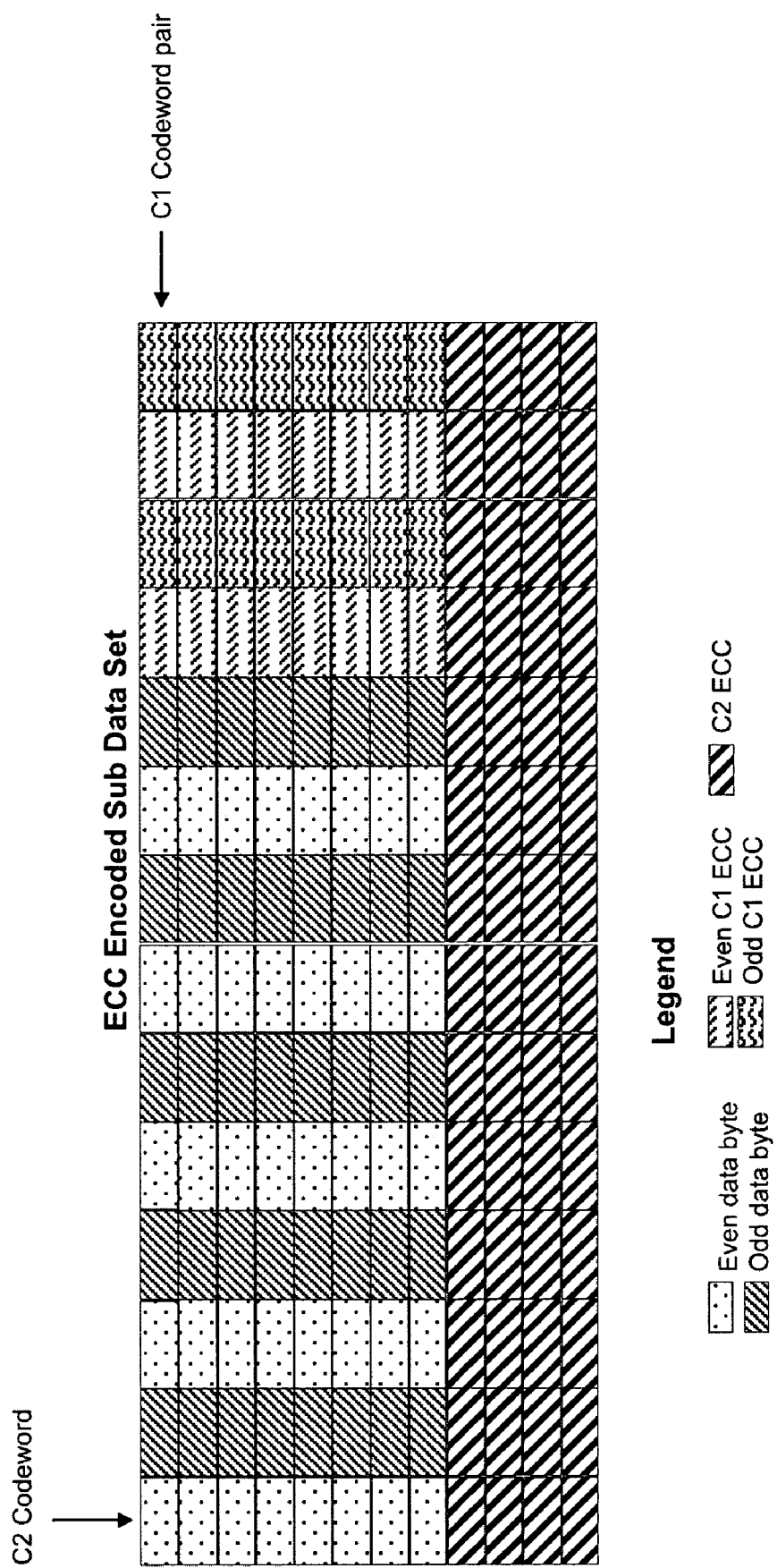
FIG. 2 is a schematic representation of an encoded data set, including interleaved C1 and C2 ECC.

The Linear Tape Open (LTO) format is based on the concept of data sets (the smallest unit written to tape) and subdata sets. A data set contains two types of data: user data and administrative information about the data set, the latter being in a Data Set Information Table (DSIT). All data is protected by an error correction code (ECC) to minimize data loss due to errors or defects. A data set comprises a number of subdata sets, each containing data arranged in rows. A subdata set row may contain user data or contain the DSIT. As illustrated in FIG. 2, each row consists of two interleaved byte sequences. A first level ECC (C1 ECC) is computed separately for the even bytes and for the odd bytes for each row. The resulting C1 ECC even and odd parity bytes are appended to the corresponding row, also in an interleaved fashion. The ECC protected row is the Codeword Pair (CWP). The even bytes form the even C1 Codeword while the odd bytes form the odd C1 Codeword. A second level ECC (C2 ECC) is computed for each column and the resulting C2 ECC parity bytes are appended to the corresponding columns. The ECC protected column is a C2 Codeword.

The subdata set, when so protected by C1 and C2 ECC, is the smallest ECC-protected unit written to tape. Each subdata set is independent with respect to ECC; that is, errors in a subdata set affect only that subdata set. The power of any ECC algorithm depends upon the number of parity bytes and is stated in terms of its correction capability. For a given number of $N_1 - K_1$ C1-parity bytes computed for a C1 codeword, up to floor$((N_1-K_1)/4)$ errors may be corrected in each of the two interleaves of that codeword, where floor(x) denotes the integer part of the real number x. And, for a given number of $N_2 - K_2$ C2-parity bytes computed for a C2 codeword, up to floor$((N_2-K_2)/2)$ errors or $N_2-K_2$ erasures may be corrected in that C2 Codeword.

It will be appreciated that multiple errors in the same subdata set can overwhelm the ability of the C1 or the C2 correction power to the extent that an error occurs when the data is read. Errors may be caused by very small events such as small particles or small media defects. Errors may also be caused by larger events such as scratches, tracking errors or mechanical causes.

To mitigate the possibility that a single large error will affect multiple Codewords in a single subdata set, some methods of writing place Codewords from each subdata set as far apart as possible along and across the tape surface. A single error would therefore have to affect multiple Codewords from the same subdata set before the ECC correction capability is overwhelmed. Spatial separation of Codewords from the same subdata set reduces the risk and is accomplished in the following manner for a multi-track recording format. For each track of a set of tracks being recorded simultaneously, a Codeword Quad (CQ) is formed by combining a Codeword Pair from one subdata set with a Codeword Pair from a different subdata set. The resulting CQ is written on one of the multiple recorded tracks. In like manner, CQs are formed for all remaining tracks by combining Codeword Pairs, all Codeword Pairs being from differing subdata sets. The group of CQs written simultaneously is called a CQ Set.

Figure 3:
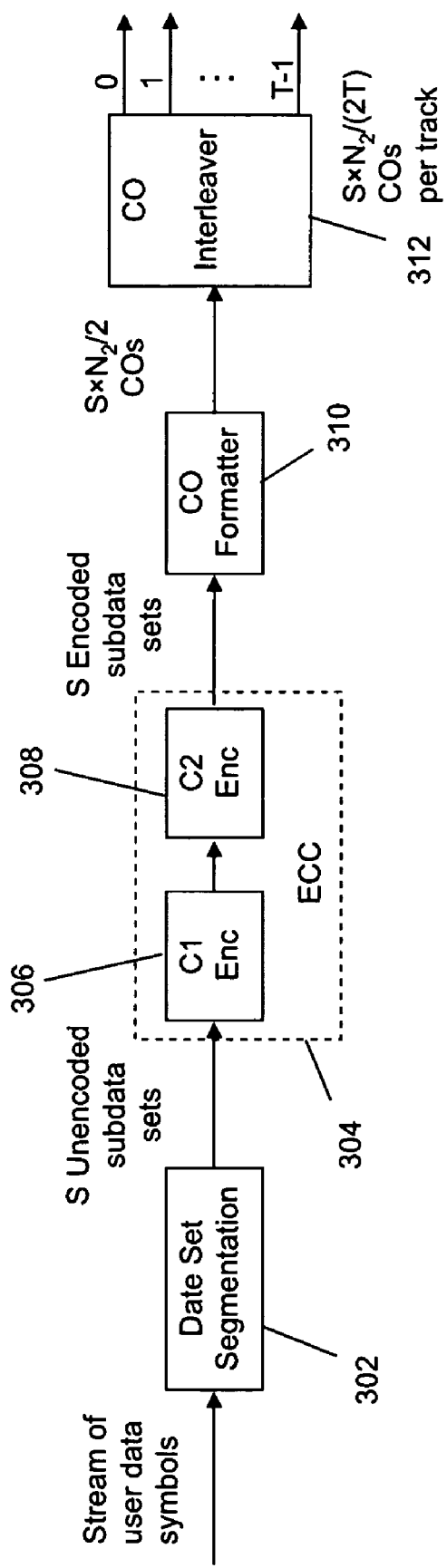
FIG. 3 is a block diagram of components of the present invention used to form data sets from a stream of user data symbols.
Figure 4B:
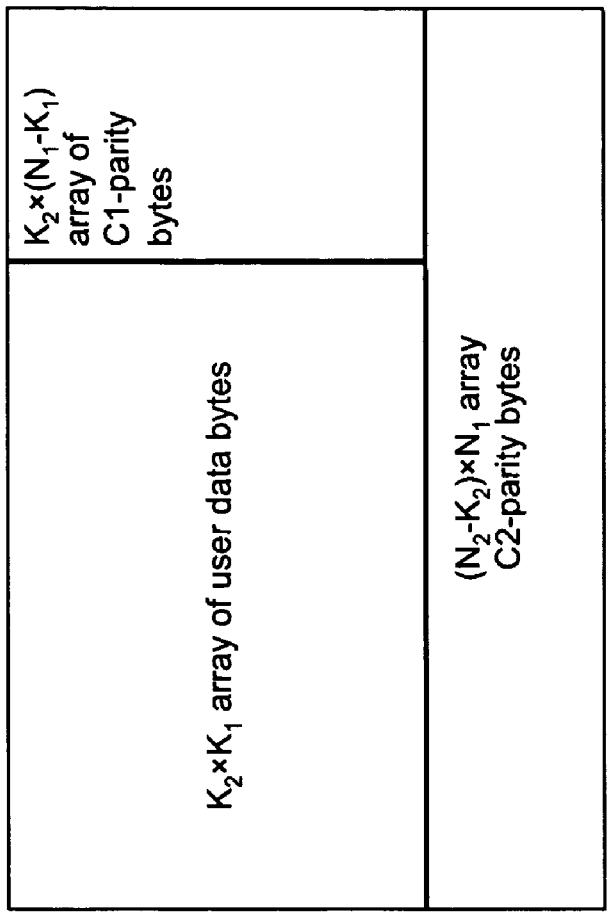
FIGS. 4A and 4B are schematic representations of unencoded and encoded subdata sets, respectively.
Figure 4A:
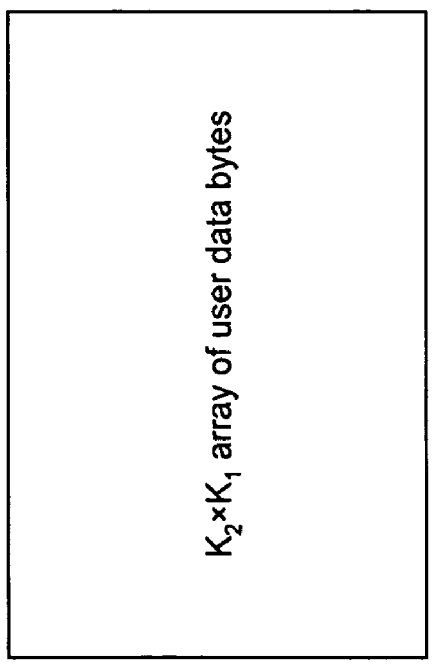

As illustrated in the block diagram of FIG. 3, data sets of a specified fixed size are formed by segmentation of a stream of user data symbols in a data set segmentation module 302. The data set is further partitioned into S unencoded subdata sets. The subdata set structure is matched to an ECC module 304, which is based on a C1/C2 product code. The unencoded subdata sets comprise 2-dimensional arrays of bytes of size $K_2 \times K_1$, where $K_1$ and $K_2$ are the dimensions of the C1 and C2 code, respectively (FIG. 4A). A C1-encoder 306 operates on rows and adds parity bytes in each row. A C2-encoder 308 operates on the C1-encoded columns and appends parity in each column. The resulting C1/C2-encoded subdata set is an $N_2 \times N_1$ array of bytes, where $N_1$ and $N_2$ are the lengths of the C1 and C2 code, respectively (FIG. 4B). It will be appreciated that, although in FIG. 3 and in FIG. 4 the C1 encoding is shown as being performed first followed by the C2 encoding, the resulting encoded subdata sets are the same regardless of whether C1 encoding is performed first followed by C2 encoding or whether C2 encoding is performed first followed by C1 encoding.

In LTO-3/4, S=64 subdata sets (or codewords) form a data set (DS), the C1 code has length $N_1=480$ and the C2 code has length $N_2=64$. The C1-codewords within a DS are fully determined by the subdata set (SDS) number (in the range from 0 to S−1) and by the row number within the subdata set (codeword array). In LTO-3/4, this assignment is called codeword pair designation. It is determined by the following expression:

C1-codeword_number=SDS_number+64×row_number, where SDS_number=0, 1, 2, ..., S−1 and row_number=0, 1, ..., 63. For LTO-3/4, the C1-codeword_number index takes values from 0 to 4095.

Figure 5:
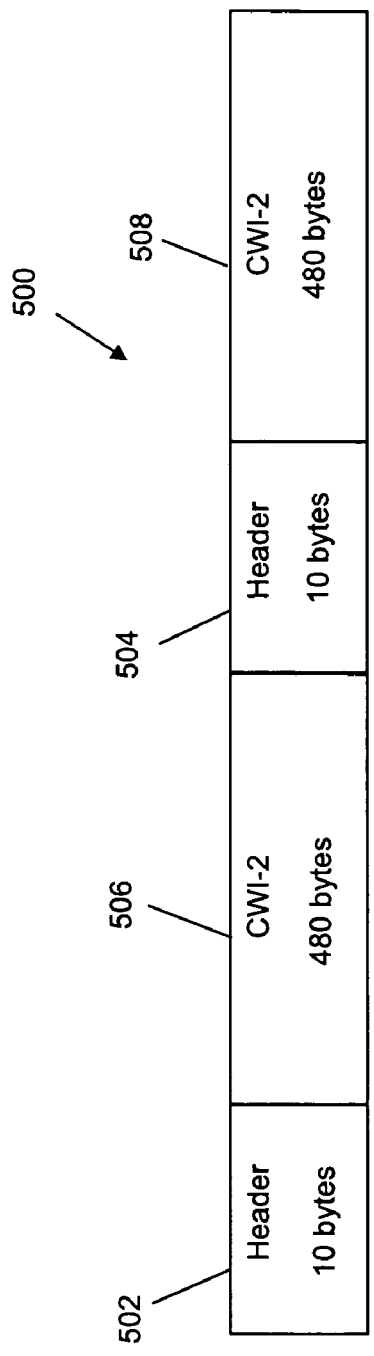
FIG. 5 illustrates a codeword object (CO) of the present invention.

A structure 500 as shown in FIG. 5 is a Codeword Object (CO) structure and reflects the organization of the basic unit that includes C1-codewords and associated headers.

From the ECC module 304, a CO formatter 310 forms COs consisting of two 10-byte headers 502, 504 and of two C1-codewords 506, 508 out of the S×$N_2$=4096 C1-codewords per DS. Thus, there are S×$N_2$/2=2048 COs, which are numbered from 0 to 2047. The CO structure 500 with index CO_number contains the two C1-codewords with indices C1-codeword_number that are related as follows. The indices C1-codeword_number_0 and C1-codeword_number_1 of the first and second C1-codewords, respectively, are given by C1-codeword_number_0=2×CO_number C1-codeword_number_1=2×CO_number+1.

According to a first embodiment of the present invention, the C2-code generated by the C2 encoder 308 is a Reed-Solomon (RS) code of length $N_2$=96 over the Galois field GF(256). The Galois field GF($2^8$) is defined by the primitive polynomial P(z)=$z^8+z^4+z^3+z^2+1$ and the primitive element in GF($2^8$)=GF(2)[z]/($z^8+z^4+z^3+z^2+1$) is:

α=(0 0 0 0 0 0 1 0)=z(modulo $z^8+z^4+z^3+z^2+1$).

Note that $\alpha^{255}$=1. The generator polynomials for the C2-codes are chosen to have as few different coefficients as possible, which helps reduce the complexity of encoders and decoders. In particular, the generator polynomial for the [$N_2$=96, $K_2$=84, $d_{min}$=13] RS-code is given by:

$$G(x) = \prod_{i=1,\ldots,6} (x+\alpha^{128-i})(x+\alpha^{127+i})$$
$$= \prod_{i=1,\ldots,6} (x^2+(\alpha^{128-i}+\alpha^{127-i})x+1)$$
$$= x^{12}+\alpha^{224}x^{11}+\alpha^{32}x^{10}+\alpha^{209}x^9+\alpha^{99}x^8+\alpha^{32}x^7+$$
$$\alpha^{80}x^6+\alpha^{32}x^5+\alpha^{99}x^4+\alpha^{209}x^3+\alpha^{32}x^2+\alpha^{224}x+1.$$

Figure 6:
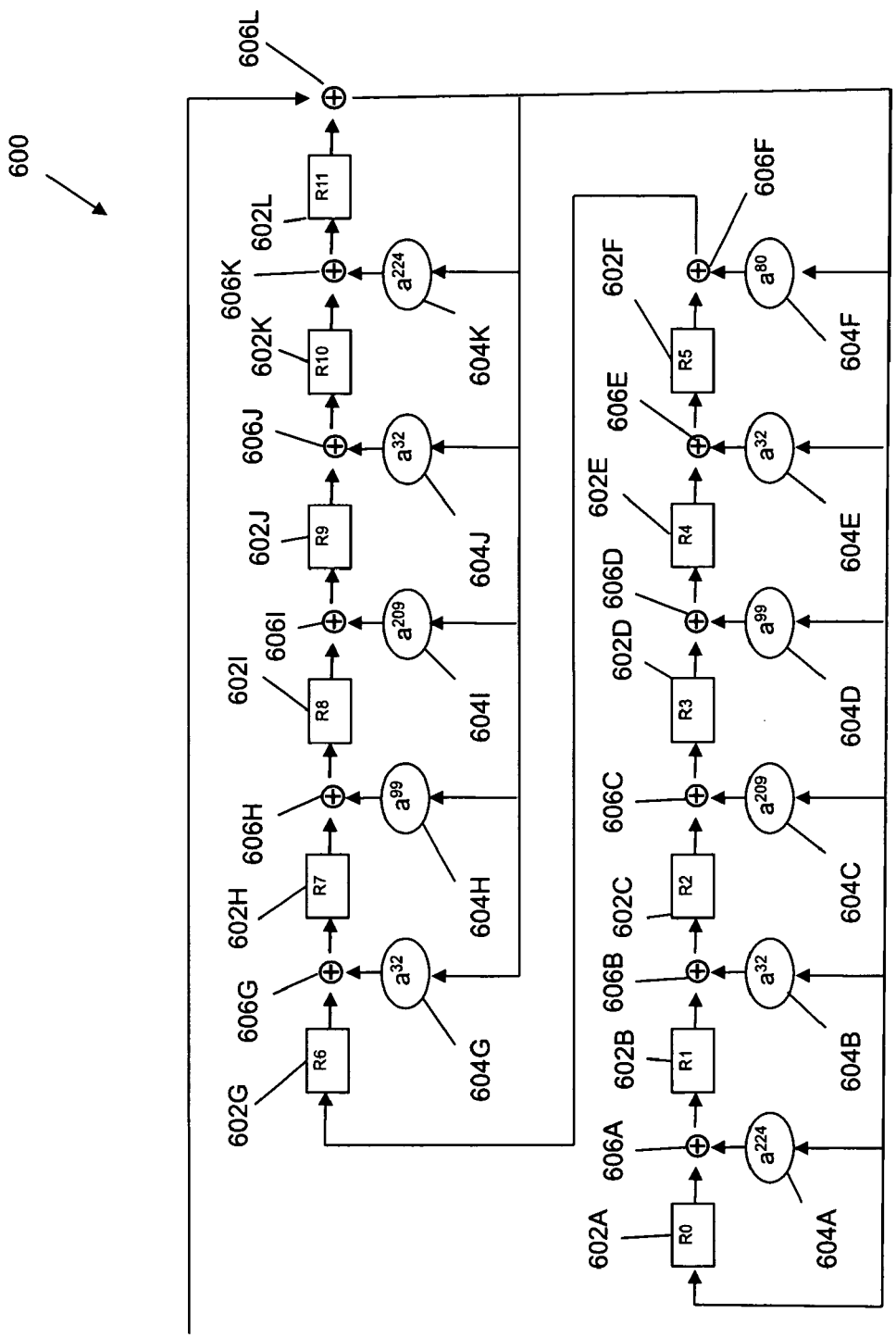
FIG. 6 is a logic diagram of a C2-encoder of the present invention for a [96, 84, 13]-RS code.

The encoding by the C2 encoder 308 is performed by a linear feedback shift register (LFSR) 600 as shown in FIG. 6. In the example illustrated, the LFSR 600 includes 12 registers R0 to R11 (602A-602L) and 11 multipliers 604A-604K whose feedback coefficients $\alpha^c$ are given by the generator polynomial of the [96,84,13]-RS code. The initial state of the LFSR 600 is the all-zero state. The $N_2-K_2$=12 parity bytes of an RS codeword are obtained by clocking all the systematic $K_2$=84 data bytes through the LFSR, multiplying them in the respective multipliers 604A-604L, adding 606A-606K the results to the respective register outputs and reading out registers R0 to R11 (602A-602L). In an actual implementation, the number of multipliers may be reduced by "reusing" multipliers whose coefficients are duplicated. For example, although illustrated as separate multipliers, multipliers 604A and 604K, having the common coefficient $\alpha^{224}$, may be implemented as a single multiplier, multipliers 604B, 604E, 604G and 604J, having the common coefficient $\alpha^{32}$, may be implemented as a single multiplier, etc. Thus, the LFSR 600 may be more efficiently implemented with five multipliers instead of 11. Moreover, the number n of registers, the number n of adders and the number n−1 of multipliers may be greater than or less than the numbers illustrated in FIG. 6 to accommodate different codes.

Additional generator polynomials may also be defined. A generator polynomial for a [128,112,17] code is given by:

$$G(x) = \prod_{i=1,\ldots,8} (x+\alpha^{128-i})(x+\alpha^{127+i})$$
$$= x^{16}+\alpha^{240}x^{15}+\alpha^{892}x^{14}+\alpha^{212}x^{13}+\alpha^{79}x^{12}+\alpha^{192}x^{11}+$$
$$\alpha^{116}x^{10}+\alpha^{151}x^9+\alpha^{198}x^8+\alpha^{151}x^7+\alpha^{116}x^6+\alpha^{192}x^5+$$
$$\alpha^{79}x^4+\alpha^{212}x^3+\alpha^{89}x^2+\alpha^{240}x+1.$$

And, a generator polynomial for a [192,168,25] RS code is given by:

$$G(x) = \prod_{i=1,\ldots,12} (x+\alpha^{128-i})(x+\alpha^{127+i})$$
$$= x^{24}+\alpha^{90}x^{23}+\alpha^{98}x^{22}+\alpha^{228}x^{21}+\alpha^2 x^{20}+\alpha^{26}x^{19}+$$
$$\alpha^{48}x^{18}+\alpha^{43}x^{17}+\alpha^{34}x^{16}+\alpha^{183}x^{15}+\alpha^{65}x^{14}+\alpha^{170}x^{13}+$$
$$\alpha^{24}x^{12}+\alpha^{170}x^{11}+\alpha^{65}x^{10}+\alpha^{183}x^9+\alpha^{34}x^8+\alpha^{43}x^7+$$
$$\alpha^{48}x^6+\alpha^{26}x^5++\alpha^{65}x^{10}+\alpha^2 x^4+\alpha^{228}x^3+\alpha^{98}x^2+$$
$$\alpha^{90}x+1.$$

Figure 7:
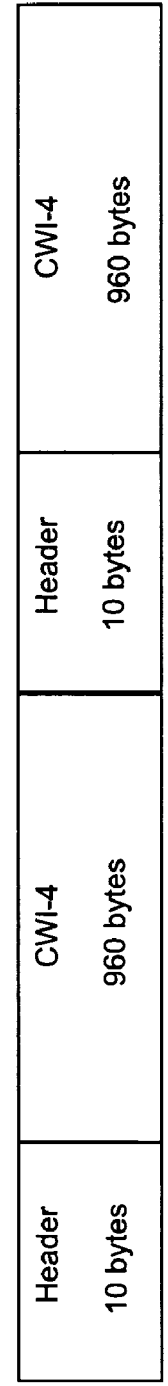
FIG. 7 illustrates an alternative CO of the present invention.

It is assumed that the C1-codewords are pre-defined and, thus, their length $N_1$ is given. That is, the C1-code may be a 2-way interleaved RS-code of length 480 as in LTO-4, as illustrated in FIG. 5, or may be a 4-way interleaved RS-code of length 960, as illustrated in FIG. 7. The format of the present invention includes subdata sets, which are arrays of dimension $N_2 \times N_1$, where $N_2$=96, and a predetermined number S of subdata sets forms a data set. The codeword number is determined by the expression:

C1-codeword_number=SDS_number+S×row_number, where SDS_number=0, 1, 2, ..., S-1 and row_number=0, 1, ..., $N_2$-1.

The CO structures are mapped onto the logical tracks (16 for LTO-3/4) according to the information in the header, viz., C1-codeword_number index. This mapping will be referred to as CO-interleaving and is performed in a CO interleaver 312 (FIG. 3). In LTO-4, the CO structures is referred to as a codeword quad because it consists of four RS codewords. In this case, there are S=64 subdata sets per DS.

An alternative CO structure is shown in FIG. 7, where one C1-codeword consists of a 4-way interleaved RS-code. This CO structure is referred to as a codeword octet. In this case, the DS is partitioned into S=32 subdata sets.

Again, each CO consists of two 10-byte headers and two C1-codewords out of the S×$N_2$ C1-codewords per DS and, thus, there are S×$N_2$/2 COs, which are numbered in consecutive order starting from 0. The CO structure with index CO_number contains the two C1-codewords with indices C1-codeword_number that are related as follows. The indices C1-codeword_number_0 and C1-codeword_number_1 of the first and second C1-codewords, respectively, are given by:

C1-codeword_number_0=2×CO_number

C1-codeword_number_1=2×CO_number+1.

Therefore, two C1-codewords in an CO are taken from two SDSs with consecutive SDS_number indices.

Figure 8:
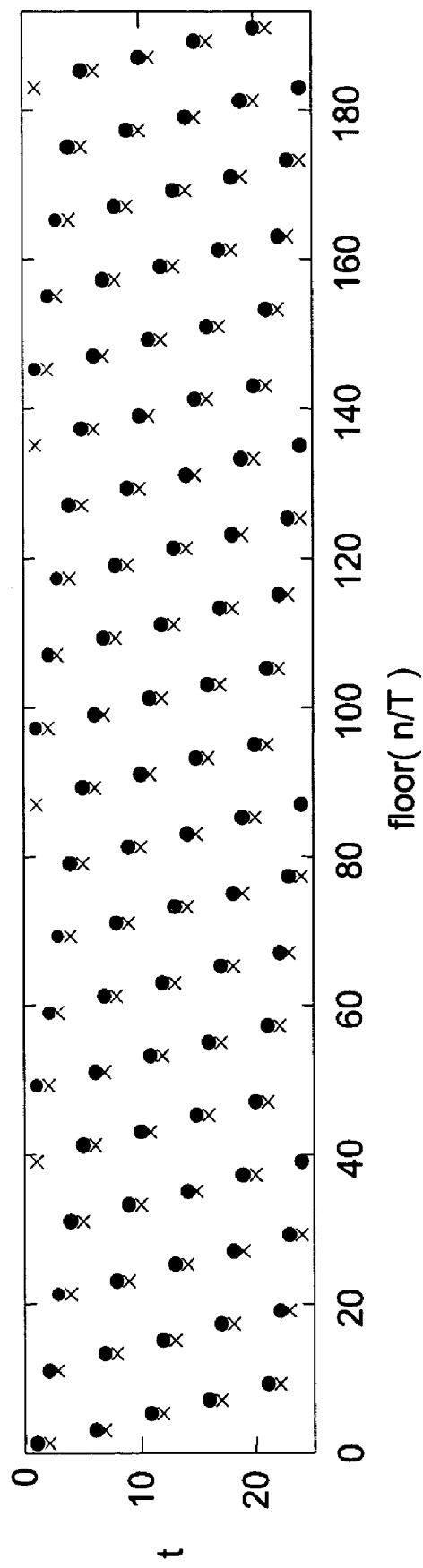
FIG. 8 illustrates an example of a distribution of subdata sets along 24 tracks of recording media in accordance with the present invention.

The COs are written simultaneously onto the tape in batches of T COs, where T is the number of concurrent active tracks. The CO-interleaver 312 assigns a logical track number t in the range 0, 1, ..., T−1 to each CO of the DS. Thus, the $S \times N_2/2$ COs of a DS are grouped into batches of T COs based on their consecutive CO_number indices and then these batches are written onto the T active tracks. Thereby, one CO of each batch is written onto one of the T tracks in a one-to-one fashion, which is determined by the CO-interleaver 312. More specifically, the CO-interleaver 312 maps a CO structure with index n=CO_number to logical track number t based on the formula:

$$t \equiv 5 \text{ floor}(2n/S) + n \pmod{T} \quad \text{[Expression 1]}$$

where floor(x) denotes the integer part of the real number x and (mod T) denotes the modulo operation with modulus T in which the remainder is in the range 0, 1, ..., T−1. For $N_2=96$, one can accommodate T=16, 24, 32, 48 or 96 parallel tracks. In FIG. 8, the result of the CO-interleaving is illustrated for a DS with S=96 SDSs by showing the data set layout of two pairs of SDSs along T=24 tracks. The 96 dots correspond to the 96 COs of the SDSs with SDS_number 0 and 1; the 96 crosses correspond to the 96 COs of the SDSs with SDS_number 2 and 3. It can be seen that the 96 C1-codewords within a SDS are uniformly distributed along and across the T=24 tracks.

The approach described in the embodiment described above is general and may be applied also to C2-codes of length $N_2=128$ and $N_2=192$. In both cases, the CO-interleaving Expression 1 is valid. For $N_2=128$, one can accommodate T=16, 32, 64 or 128 parallel tracks and, for $N_2=192$, there can be T=16, 24, 32, 48, 64, 96, or 192 tracks. When designing a C2-code of the present invention, a determination would first be made of the number of possible parallel tracks $T_1, T_2, \ldots, T_m$ to which COs are to be written. $N_2$ may then be calculated as the least common multiple of numbers $T_1, T_2, \ldots, T_m$. For example, if it is desired to accommodate T=16, 24, 32, 48 or 96 parallel tracks, the least common multiplier is $N_2=96$. Similarly, if it is desired to accommodate T=16, 32, 64 or 128 parallel tracks, the least common multiplier is $N_2=128$. And, if it is desired to accommodate T=T=16, 24, 32, 48, 64, 96, or 192 parallel tracks, the least common multiplier is $N_2=192$. It will be appreciated that the foregoing are provided as examples and that the present invention is not limited to any particular value of $N_2$ or to any particular number T of parallel tracks to which the COs are to be written.

After CO-interleaving and before writing them onto tape, the COs are modulation encoded and transformed into synchronized codeword object (SCO) structures by inserting VFO, forward, resync and reverse sync fields. FIGS. 9 and 10 illustrate alternative COs. In LTO-4, the headers and codeword pairs are passed through a rate-16/17 RLL encoder resulting in RLL-encoded bit-sequences of length 85 and 4080, respectively. More generally, the CO structures can be modulation encoded using an RLL-encoder of rate $R_H$ for the header portion and an RLL-encoder of rate R for the C1-codewords (FIG. 9). For the alternative CO structure of FIG. 7, the resulting SCO-structure is illustrated in FIG. 10, where the VFO, forward sync, re-sync and reverse sync fields have some suitable lengths $L_{VFO}$, $L_{FS}$, $L_{RS}$, and $L_{FS}$, respectively.

The proposed interleaving scheme is designed to provide robustness against dead tracks and have an increased robustness against stripe errors (that is, errors across all tracks). The robustness of an ECC/CO-interleaving scheme against stripe errors depends on three factors: (i) the parameters $[N_2, K_2, d_{min}]$ of the C2-code, (ii) the interleaving depth given by the number S of subdata sets (SDS) within each Data Set (DS), and (iii) the number T of parallel channels (tracks). In case of a stripe error, the decoder operates as follows. The C1-decoder detects that certain rows in a number of subdata sets are uncorrectable and provides erasure-flags of these rows to the C2-decoder. The C2-decoder performs erasure-decoding and can correct up to $N_2-K_2-M$ erasures per subdata set while keeping a margin of M bytes to avoid miscorrections. If a stripe error along tape extends over no more than $(S/2) \times (N_2-K_2-M)/T$ SCOs, then there are no more than $(S/2) \times (N_2-K_2-M)$ COs which are affected by errors and these erroneous COs are evenly distributed by the inverse CO-interleaving map over the S/2 pairs of subdata sets of an affected DS. Thus, each subdata set will contain at most $N_2-K_2-M$ erased rows, which can be corrected and, therefore, the maximum stripe error length (MSEL) in terms of SCO units is given by:

$$\text{MSEL} = S \times (N_2-K_2-M)/(2T).$$

The absolute length of the MSEL along the tape in [mm] depends on the length of the SCO in [mm].

The maximum number of dead tracks (MNDT) that can be tolerated in the absence of channel errors can be derived in a similar manner. Specifically, the formula:

$$\text{MNDT} = \text{floor}((N_2-K_2)/(N_2/T))$$

may be used to compute the maximum number of dead tracks.

Based on the synchronized codeword quad (SCQ), which is the SCO structure of LTO-4, TABLE 1 shows specific configurations of C2-code designs and properties with regard to maximum stripe error length and dead track support. In TABLE 1, an erasure-correction margin of M=2 was assumed. It should be emphasized that the CO-interleaving Expression 1 applies in all these cases. All C2-codes with $N_2>64$ have 3.7% improved format efficiency (FE) when compared to the C2-code in LTO-4 (see first row in TABLE 1). All of these long C2-codes have improved error rate performance that translates into a gain in linear density. The linear density gains in TABLE 1 were obtained from measurements in the lab using a semi-analytic approach.

TABLE 1

Specific C2-Code Configurations for Codeword Quad-Based SCO-Structures

| $N_2$ | $K_2$ | Tracks T | S | Relative DS size | FE in % | Lin. density gain in % | MSEL in SCQs | Dead tracks |
|---|---|---|---|---|---|---|---|---|
| 64 | 54 | 16 | 64 | 1X | 0 | 0 | 16 | 2 |
| 128 | 112 | 16 | 32 | 1X | 3.7 | 6.5 | 14 | 2 |
| 128 | 112 | 16 | 64 | 2X | 3.7 | 6.5 | 28 | 2 |
| 128 | 112 | 32 | 64 | 2X | 3.7 | 6.5 | 14 | 4 |
| 128 | 112 | 32 | 128 | 4X | 3.7 | 6.5 | 28 | 4 |
| 96 | 84 | 16 | 64 | 1.5X | 3.7 | 4.0 | 20 | 2 |
| 96 | 84 | 24 | 96 | 2.25X | 3.7 | 4.0 | 20 | 3 |
| 96 | 84 | 32 | 128 | 3X | 3.7 | 4.0 | 20 | 4 |

TABLE 1-continued

Specific C2-Code Configurations for Codeword Quad-Based SCO-Structures

| $N_2$ | $K_2$ | Tracks T | S | Relative DS size | FE in % | Lin. density gain in % | MSEL in SCQs | Dead tracks |
|---|---|---|---|---|---|---|---|---|
| 192 | 168 | 16 | 32 | 1.5X | 3.7 | 8.5 | 22 | 2 |
| 192 | 168 | 24 | 48 | 2.25X | 3.7 | 8.5 | 22 | 3 |
| 192 | 168 | 32 | 64 | 3X | 3.7 | 8.5 | 22 | 4 |

In TABLES 2 and 3, the results are summarized for the two described embodiments for T=16 parallel tracks and SCO-structures, which are based on codeword quads and octets, respectively. The length of a codeword octet in [mm] is roughly twice as long as that of a codeword quad. Thus, for the ECC-1 scheme, the maximum stripe error length of 20 SCQs is comparable to 10 SCOs in TABLES 2 and 3, respectively.

TABLE 2

Proposed C2-Code Configurations for Codeword Quad-Based SCO-Structures and T = 16 Tracks

| Code | $N_2$ | $K_2$ | S | Relative DS size | FE in % | Lin. density gain in % | MSEL in SCQs | Dead tracks |
|---|---|---|---|---|---|---|---|---|
| LTO-4 | 64 | 54 | 64 | 1X | 0 | 0 | 16 | 2 |
| ECC-1 | 96 | 84 | 64 | 1.5X | 3.7 | 4.0 | 20 | 2 |
| ECC-2 | 192 | 168 | 32 | 1.5X | 3.7 | 8.5 | 22 | 2 |

TABLE 3

Proposed C2-Code Configurations for Codeword Octet-Based SCO-Structures and T = 16 Tracks.

| Code | $N_2$ | $K_2$ | S | Relative DS size | FE in % | Lin. density gain in % | MSEL in SCOs | Dead tracks |
|---|---|---|---|---|---|---|---|---|
| ECC-1 | 96 | 84 | 32 | 1.5X | 3.7 | 4.0 | 10 | 2 |
| ECC-2 | 192 | 168 | 32 | 3X | 3.7 | 8.5 | 22 | 2 |

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies regardless of the particular type of signal bearing media actually used to carry out the distribution. Examples of computer readable storage media include recordable-type media such as a floppy disk, a hard disk drive, a RAM, and CD-ROMs.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. Moreover, although described above with respect to methods and systems, the need in the art may also be met with a computer program product containing instructions for writing data to a multi-track data tape medium or a method for deploying computing infrastructure comprising integrating computer readable code into a computing system for writing data to a multi-track data tape medium.

What is claimed is:

1. A method for writing data to a multi-track data tape, comprising:
   receiving a stream of user data symbols, the stream comprising a data set;
   segmenting the data set into a plurality S of unencoded subdata sets, each subdata set comprising an array having $K_2$ rows and $K_1$ columns;
   for each of the S unencoded subdata sets, generating $N_1-K_1$ C1-parity bytes for each row of a subdata set and appending the C1-parity bytes to the end of the row to form an encoded C1 codeword having a length $N_1$;
   for each of the S unencoded subdata sets, generating $N_2-K_2$ C2-parity bytes for each column of the subdata set and appending the C2-parity bytes to the end of the column to form an encoded C2 codeword having a length $N_2$, whereby S encoded subdata set are generated having $N_2$ C1 codewords;
   from the S encoded subdata sets, forming a plurality $(S \times N_2)/2$ codeword objects (COs), each comprising a first header, a first C1 codeword, a second header and a second C1 codeword;
   mapping each CO onto a logical data track according to information within the first and second headers of the CO;
   modulation encoding the COs into synchronized COs; and
   writing T synchronized COs simultaneously to the tape, where T equals the number of concurrent active tracks on the tape.

2. The method of claim 1, further comprising:
   selecting a number of possible parallel tracks $T_1, T_2, \ldots, T_m$ to which the COs can be written; and
   determining the C2 codeword length N2 as the least common multiple of $T_1, T_2, \ldots, T_m$.

3. The method of claim 1, wherein mapping each CO comprises mapping a CO having an index n=CO_number to a logical track number t based on a formula t=5 floor(2n/S)+n (mod T), where floor(x) denotes the integer part of the real number x and (mod T) denotes the modulo operation with modulus T in which the remainder is in a range 0, 1, 2, ..., T-1.

4. The method of claim 1, wherein generating $N_2-K_2$ C2-parity bytes comprises applying an encoding operation characterized by a generator polynomial for a $[N_2, K_2, d_{min}]$ Reed-Solomon (RS) code to each column of the subdata set.

5. The method of claim 4, wherein the RS code is selected from a group comprising a [96, 84, 13] code, a [128, 112, 17] code and a [192, 168, 25] code.

6. A data storage tape device, comprising:
   a host interface through which a stream of user data symbols comprising a data set is received;

a segmenting module operable to segment the data set into a plurality S of unencoded subdata sets, each subdata set comprising an array having K2 rows and K1 columns;

a C1 encoder operable to generate $N_1-K_1$ C1-parity bytes for each row of the S unencoded subdata sets and append the C1-parity bytes to the end of the row to form an encoded C1 codeword having a length $N_1$;

a C2 encoder operable to generate $N_2-K_2$ C2-parity bytes for each column of the S unencoded sets subdata set and append the C2-parity bytes to the end of the column to form an encoded C2 codeword having a length $N_2$, whereby S encoded subdata set are generated having $N_2$ C1 codewords;

a codeword object formatter operable to form a plurality $(S \times N_2)/2$ codeword objects (COs) from the S encoded subdata sets, each CO comprising a first header, a first C1 codeword, a second header and a second C1 codeword;

a codeword object interleaver operable to map each CO onto a logical data track according to information within the first and second headers of the CO;

a modulation encoder operable to encode the COs into synchronized COs; and a write channel, including a write head, operable to write T synchronized COs simultaneously to the tape, where T equals the number of concurrent active tracks on a data storage tape.

7. The data storage tape device of claim 6, wherein the C2 codeword length $N_2$ comprises the least common multiple of $T_1, T_2, \ldots, T_m$, where $T_1, T_2, \ldots, T_m$ are a number of possible parallel tracks to which the COs are to be written.

8. The data storage tape device of claim 6, wherein the codeword object interleaver is further operable to map a CO having an index n=CO_number to a logical track number t based on a formula t=5 floor(2n/S)+n (mod T), where floor(x) denotes the integer part of the real number x and (mod T) denotes the modulo operation with modulus T in which the remainder is in a range 0, 1, 2, ..., T−1.

9. The data storage tape device of claim 6, wherein the C2 encoder is further operable to apply an encoder characterized by a generator polynomial for a [$N_2$, $K_2$, d-min] Reed-Solomon (RS) code to each column of the subdata set.

10. The data storage tape device of claim 9, wherein the RS code is selected from a group comprising a [96, 84, 13] code, a [128, 112, 17] code and a [192, 168, 25] code.

11. The data storage tape device of claim 9, wherein the C2 encoder comprises a linear feedback shift register (LFSR) having feedback coefficients provided by the generator polynomial.

12. A computer program product of a non-transitory computer readable medium usable with a programmable computer, the computer program product having computer-readable code embodied therein for writing data to a multi-track data tape, the computer-readable code comprising instructions for:

receiving a stream of user data symbols, the stream comprising a data set;

segmenting the data set into a plurality S of unencoded subdata sets, each subdata set comprising an array having $K_2$ rows and $K_1$ columns;

for each of the S unencoded subdata sets, generating $N_1-K_1$ C1-parity bytes for each row of a subdata set and appending the C1-parity bytes to the end of the row to form an encoded C1 codeword having a length $N_1$;

for each of the S unencoded subdata sets, generating $N_2-K_2$ C2-parity bytes for each column of the subdata set and appending the C2-parity bytes to the end of the column to form an encoded C2 codeword having a length $N_2$, whereby S encoded subdata set are generated having $N_2$ C1 codewords;

from the S encoded subdata sets, forming a plurality $(S \times N_2)/2$ codeword objects (COs), each comprising a first header, a first C1 codeword, a second header and a second C1 codeword;

mapping each CO onto a logical data track according to information within the first and second headers of the CO;

modulation encoding the COs into synchronized COs; and writing T synchronized COs simultaneously to the tape, where T equals the number of concurrent active tracks on the tape.

13. The computer program product of claim 12, further comprising instructions for:

selecting a number of possible parallel tracks $T_1, T_2, \ldots, T_m$ to which the COs can be written; and determining the C2 codeword length $N_2$ as the least common multiple of $T_1, T_2, \ldots, T_m$.

14. The computer program product of claim 12, wherein the instructions for mapping each CO comprise instructions for mapping a CO having an index n=CO_number to a logical track number t based on a formula t=5 floor(2n/S)+n (mod T), where floor(x) denotes the integer part of the real number x and (mod T) denotes the modulo operation with modulus T in which the remainder is in a range 0, 1, 2, ..., T−1.

15. The computer program product of claim 12, wherein the instructions for generating $N_2-K_2$ C2-parity bytes comprise instructions for applying an encoding operation characterized by a generator polynomial for a [$N_2$, $K_2$, $d_{min}$] Reed-Solomon (RS) code to each column of the subdata set.

16. The computer program product of claim 15, wherein the RS code is selected from a group comprising a [96, 84, 13] code, a [128, 112, 17] code and a [192, 168, 25] code.

17. A hardware apparatus for encoding a stream of user data symbols comprising a data set, comprising:

a segmenting module operable to segment the data set into a plurality S of unencoded subdata sets, each subdata set comprising an array having $K_2$ rows and $K_1$ columns;

a C1 encoder operable to generate $N_1-K_1$ C1-parity bytes for each row of the S unencoded subdata sets and append the C1-parity bytes to the end of the row to form an encoded C1 codeword having a length $N_1$;

a C2 encoder operable to generate $N_2-K_2$ C2-parity bytes for each column of the S unencoded subdata sets and append the C2-parity bytes to the end of the column to form an encoded C2 codeword having a length $N_2$, whereby S encoded subdata set are generated having $N_2$ C1 codewords;

a codeword object formatter operable to form a plurality $(S \times N_2)/2$ codeword objects (COs) from the S encoded subdata sets, each CO comprising a first header, a first C1 codeword, a second header and a second C1 codeword;

a codeword object interleaver operable to map each CO onto a logical data track according to information within the first and second headers of the CO; and a modulation encoder operable to encode the COs into synchronized COs for recording onto a multi-track storage media.

18. The encoding apparatus of claim 17, wherein the C2 codeword length $N_2$ comprises the least common multiple of $T_1, T_2, \ldots, T_m$, where $T_1, T_2, \ldots, T_m$ are a number of possible parallel tracks to which the COs can be written.

19. The encoding apparatus of claim 17, wherein the codeword object interleaver is further operable to map a CO having an index n=CO_number to a logical track number t based on a formula t=5 floor(2n/S)+n (mod T), where floor(x) denotes the integer part of the real number x and (mod T) denotes the modulo operation with modulus T in which the remainder is in a range 0, 1, 2, ..., T−1.

20. The encoding apparatus of claim 17, wherein the C2 encoder is further operable to apply an encoder characterized by a generator polynomial for a [$N_2$, $K_2$, $d_{min}$] Reed-Solomon (RS) code to each column of the subdata set.

21. The encoding apparatus of claim 20, wherein the RS code is selected from a group comprising a [96, 84, 13] code, a [128, 112, 17] code and a [192, 168, 25] code.

22. The encoding apparatus of 20, wherein the C2 encoder comprises a linear feedback shift register (LFSR) having feedback coefficients provided by the generator polynomial.

23. A method for deploying computing infrastructure, comprising integrating computer readable code into a computing system, wherein the code, in combination with the computing system, is capable of performing the following:
receiving a stream of user data symbols, the stream comprising a data set;
segmenting the data set into a plurality S of unencoded subdata sets, each subdata set comprising an array having $K_2$ rows and $K_1$ columns;
for each of the S unencoded subdata sets, generating $N_1$−$K_1$ C1-parity bytes for each row of a subdata set and appending the C1-parity bytes to the end of the row to form an encoded C1 codeword having a length $N_1$;
for each of the S unencoded subdata sets, generating $N_2$−$K_2$ C2-parity bytes for each column of the subdata set and appending the C2-parity bytes to the end of the column to form an encoded C2 codeword having a length $N_2$, whereby S encoded subdata set are generated having $N_2$ C1 codewords;
from the S encoded subdata sets, forming a plurality (S×$N_2$)/2 codeword objects (COs), each comprising a first header, a first C1 codeword, a second header and a second C1 codeword;
mapping each CO onto a logical data track according to information within the first and second headers of the CO;
modulation encoding the COs into synchronized COs; and
writing T synchronized COs simultaneously to the tape, where T equals the number of concurrent active tracks on a data storage tape.

24. The method of claim 23, wherein mapping each CO comprises mapping a CO having an index n=CO_number to a logical track number t based on a formula t=5 floor(2n/S)+n (mod T), where floor(x) denotes the integer part of the real number x and (mod T) denotes the modulo operation with modulus T in which the remainder is in a range 0, 1, 2, ..., T−1.

25. The method of claim 23, wherein generating $N_2$−$K_2$ C2-parity bytes comprises applying an encoding operation characterized by a generator polynomial for a [$N_2$, $K_2$, $d_{min}$] Reed-Solomon (RS) code to each column of the subdata set.

26. A C2 encoder for a multi-track data tape device, the C2 encoder comprising:
a first plurality of n=12 shift registers R(0)-R(11), each register having an input and an output;
a like plurality of adders A(0)-A(11), each adder having first and second inputs and an output, the first input of a last adder A(11) coupled to receive a plurality S of input subdata sets, each input subdata set comprising an array having $S_r$ rows and $S_c$ columns, the second input of each adder A(0)-A(11) being coupled to the output of a register R(0)-R(11), respectively, and the output of each adder A(0) through A(10) being coupled to the input of a register (R1)-R(11), respectively, and the output of the last adder A(11) being coupled to the input of the first register R(0);
a second plurality of n−1=11 fixed-byte multipliers M(0)-M(10), each multiplier M(0)-M(10) having an input coupled to the output of the last adder A(11) and each multiplier M(0)-M(10) having an output coupled to the second input of each adder A(0)-A(10), respectively, the multipliers having feedback coefficients $\alpha^c$ given by a generator polynomial of a [N2=96,K2=84,13] Reed-Solomon code, the feedback coefficients comprising:
M(0): $\alpha^{224}$;
M(1): $\alpha^{32}$;
M(2): $\alpha^{209}$;
M(3): $\alpha^{99}$;
M(4): $\alpha^{32}$;
M(5): $\alpha^{80}$;
M(6): $\alpha^{32}$;
M(7): $\alpha^{99}$;
M(8): $\alpha^{209}$;
M(9): $\alpha^{32}$; and
M(10): $\alpha^{224}$;
wherein the C2 encoder is operable to generate $N_2$−$K_2$=n=12 C2-parity bytes for each column of the input subdata set and append the C2-parity bytes to the end of the column to form an encoded C2 codeword having a length $N_2$, whereby S C2-extended output subdata sets are generated, each C2-extended output subdata set having $S_c$ C2 codewords.

27. The C2 encoder of claim 26, wherein:
multipliers M(0) and M(10) comprise a single multiplier;
multipliers M(1), M(4), M(6) and M(9) comprise a single multiplier;
multipliers M(2) and M(8) comprise a single multiplier; and
multipliers M(3) and M(7) comprise a single multiplier.

28. The C2 encoder of claim 26, wherein input subdata sets are unencoded subdata sets received from a segmenting module operable to segment a stream of user data symbols comprising a data set, each unencoded subdata set comprising an array having $S_r$=$K_2$ rows and $S_c$=$K_1$ columns.

29. The C2 encoder of claim 26, wherein input subdata sets are C1-encoded subdata sets received from a C1 encoder generating codewords having a length $N_1$, each C1-encoded subdata set comprising an array having $S_r$=$K_2$ rows and $S_c$=$N_1$ columns.

* * * * *